(12) United States Patent
Braeuninger-Weimer et al.

(10) Patent No.: US 12,284,921 B2
(45) Date of Patent: Apr. 22, 2025

(54) HIGH TEMPERATURE SUPERCONDUCTING STRUCTURES

(71) Applicant: Deep Science, LLC, Bellevue, WA (US)

(72) Inventors: Philipp Braeuninger-Weimer, Bellevue, WA (US); Brian C. Holloway, Bellevue, WA (US); Vladimir Z. Kresin, Oakland, CA (US); Stuart A. Wolf, Bowie, MD (US); George Albert Sawatzky, Surrey (CA); Christoph Heil, Graz (AT)

(73) Assignee: Enterprise Science Fund, LLC, Bellevue, WA (US)

( * ) Notice: Subject to any disclaimer, the term of this patent is extended or adjusted under 35 U.S.C. 154(b) by 1163 days.

(21) Appl. No.: 16/789,143

(22) Filed: Feb. 12, 2020

(65) Prior Publication Data

US 2020/0259066 A1    Aug. 13, 2020

Related U.S. Application Data

(60) Provisional application No. 62/805,225, filed on Feb. 13, 2019.

(51) Int. Cl.
*H10N 60/85* (2023.01)
*C01B 32/20* (2017.01)

(52) U.S. Cl.
CPC ........... *H10N 60/851* (2023.02); *C01B 32/20* (2017.08)

(58) Field of Classification Search
CPC .............................. H10N 60/851; C01B 32/20
See application file for complete search history.

(56) References Cited

U.S. PATENT DOCUMENTS 7,482,298 B2    1/2009   Nepela
9,803,285 B1 *  10/2017  Robinson ................ C23C 28/00
(Continued)

FOREIGN PATENT DOCUMENTS

EP        2 221 874 A1    8/2010
WO   WO-2004/014794 A2    2/2004

OTHER PUBLICATIONS

Lee et al. "Exfoliation of Electrolyte-Intercalated Graphene: Molecular Dynamics Simulation Study" J. Phys. Chem. C 2015, 119, 19415-19422 (Year: 2015).*

(Continued)

*Primary Examiner* — Paul A Wartalowicz
(74) *Attorney, Agent, or Firm* — PCFB, LLC; Justin K. Flanagan

(57) ABSTRACT

A superconductor device includes a low-dimensional material with a critical temperature higher than a critical temperature corresponding to a bulk form of the low-dimensional material. The low-dimensional material can include shape and structural modifications of a low-dimensional material. The superconductor device can include various conformational arrangements of the low-dimensional material such as nanoribbons, nanotubes, or helices. The superconductor device can include functional groups, such as hydrogen, attached to the low-dimensional material. The superconductor device can include metallic clusters located in proximity to the low-dimensional material. The superconductor device can include a low-dimensional material which is a monolayer, bilayer or multilayer.

10 Claims, 6 Drawing Sheets

(56) References Cited

U.S. PATENT DOCUMENTS

| 2011/0130292 | A1 | 6/2011 | Kawashima |
| 2015/0337092 | A1* | 11/2015 | Sjong .................. H05K 1/0346 525/424 |
| 2016/0240765 | A1 | 8/2016 | Washington et al. |
| 2019/0051905 | A1* | 2/2019 | Zhamu .................. H01M 4/525 |

OTHER PUBLICATIONS

Geballe et al. Synthesis and Stability of Lanthanum Superhydrides. Angew. Chem. Int. Ed. 2018, 57, 688-692. (Year: 2018).*

Bulaevskii L.N. et al: "Strong Suppression of Two-Dimensional Superconductivity in Metals by Impurities", Soviet Physics JETP, American Institute of Physics. New York, US, vol. 69, No. 1, Jul. 1, 1989 (Jul. 1, 1989), pp. 125-127, XP000099878, 2 pages.

International Search Report for PCT Appl. No. PCT/US2020/017957 mailed Aug. 5, 2020, 20 pages.

Freitas et al., Strong enhancement of superconductivity at high pressures within the charge-density-wave states of 2H—TaS2 and 2H—TaSe2. Jun. 3, 2016, 6 pages.

Hartman et al., Photo-double-ionization mechanisms in aromatic hydrocarbons. Physical Review, Jun. 5, 2013, 8 pages. A 87, 063403.

Kawashima, Y., Observation of the Meissner effect at room temperature in single-layer graphene brought into contact with alkanes, 12 pages.

Kawashima, Y., Possible room temperature superconductivity in conductors obtained by bringing alkanes into contact with a graphite surface. AIP Advances 3, 052132. May 24, 2013, 8 pages.

Kawashima, Y., Superconductivity above 500 K in conductors made by bringing n-alkane into contact with graphite. 19 pages.

Kawashima et al., Protolytic decomposition of n-octane on graphite at near room temperature. Scientific Reports. Jun. 23, 2016, 8 pages.

Kresin et al., Effects related to pair correlation of p electrons. The Journal of Chemical Physics 63, 3613. Jul. 15, 1974, 12 pages.

Kresin, V., Pair Correlation of Superconductive Type in Polycyclic Molecules. Physics Letters, vol. 24A, No. 13. May 13, 1967, pp. 749-750.

Kresin, V., Paths to Room-Temperature Superconductivity. J Supercond Nov Magn 2018, 31, pp. 611-617.

Kubozono, et al., Recent progress on carbon-based superconductors. Journal of Physics: Condensed Matter. Jun. 28, 2016, 334001, 16 pages.

Little, W., Possibility of Synthesizing an Organic Superconductor. Physical Review. Jan. 27, 1964, pp. A1416-A1424, vol. 134, No. 6A.

Liu, W. et al., Magnetization of potassium-doped p-terphenyl and p-quaterphenyl by high-pressure synthesis. Physical Review, Dec. 1, 2017, 5 pages, B 96, 224501.

Margine, E. et al., Two-gap superconductivity in heavily n-doped graphene: Ab initio Migdal-Eliashberg theory. Physical Review, Jul. 29, 2014, B 90, 014518, 7 pages.

Mitsuhashi, R. et al., Superconductivity in alkali-metal-doped picene, Nature, Mar. 4, 2010, pp. 76-79, vol. 464.

Savini, G. et al., First-Principles Prediction of Doped Graphane as a High-Temperature Electron-Phonon Superconductor, Physical Review Letters, Jul. 16, 2010, 4 pages, 105, 037002.

Wang, R. et al., Superconductivity above 120 kelvin in a chain link molecule. 2017, 19 pages.

Wehlitz, R. et al., Photoemission of Cooper Pairs from Aromatic Hydrocarbons. Physical Review Letters, Nov. 9, 2012, 5 pages, 109, 193001.

Xue, M. et al. Superconductivity above 30 K in alkali-metal-doped hydrocarbon, Scientific Reports, Apr. 30, 2012, 4 pages.

Yan, J. et al., Observation of Meissner effect in potassium-doped p-quaterphenyl, Jan. 26, 2018, 6 pages.

Zhong, G. et al., Superconductivity and Its Enhancement in Polycyclic Aromatic Hydrocarbons, Frontiers in Physics. Apr. 12, 2019, 10 pages.

Deep Science, LLC, Chinese Patent Application No. 202080012672. 8, Office Action Mailed Feb. 2, 2024, 18 pp.

Varshney, et al., Superconductivity in alkali metal doped fullerenes ($K_3C_{60}$): a phonon mechanism, J. of Physics and Chemistry of Solids, 60, 1999, p. 579-585.

* cited by examiner

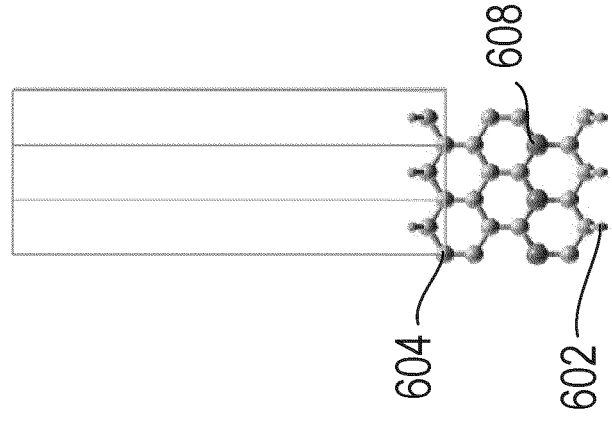
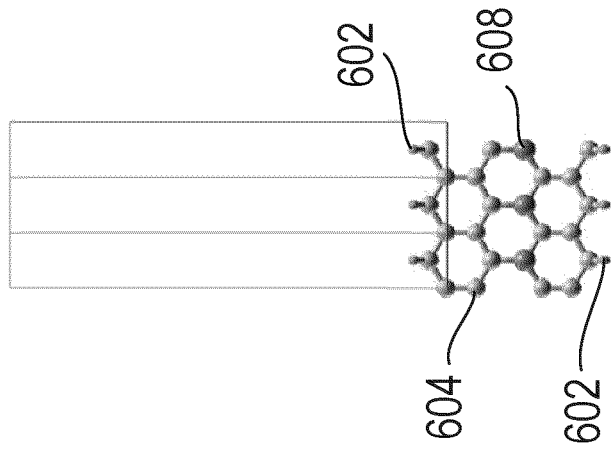
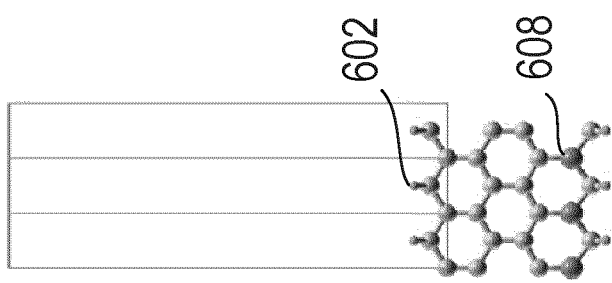
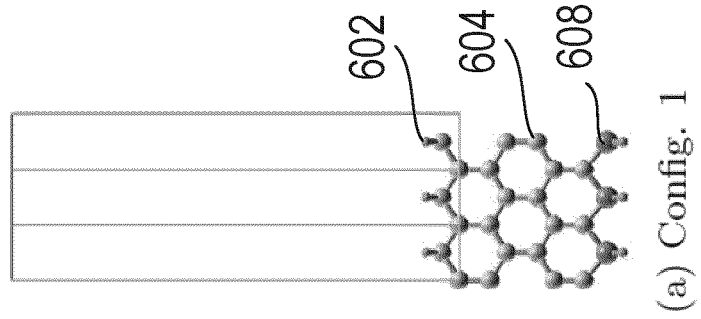
FIG. 6A (a) Config. 1
FIG. 6B (b) Config. 2
FIG. 6C (c) Config. 3
FIG. 6D (d) Config. 4

HIGH TEMPERATURE SUPERCONDUCTING STRUCTURES

CROSS-REFERENCE TO RELATED APPLICATIONS

The present application claims the benefit of and priority to U.S. Provisional Patent Application 62/805,225, filed Feb. 13, 2019, which is hereby incorporated by reference herein in its entirety.

BACKGROUND

Superconductors are materials that exhibit zero electrical resistance and expulsion of magnetic flux fields, under conditions such as being cooled below a critical temperature. The superconductivity phenomenon can be characterized by the Meissner effect, which is a complete ejection of magnetic field lines from the interior of the superconductor as the material transitions into the superconducting state. Superconductors usually have transition temperatures below 30 K. A superconductor is generally considered high-temperature if the material reaches a superconducting state at a temperature that can be cooled by liquid nitrogen (critical temperature $(T_c)$>77 K).

SUMMARY

At least one aspect of the present disclosure relates a superconductor device having a low-dimensional material with a critical temperature higher than a critical temperature corresponding to a bulk form of the low-dimensional material. The low-dimensional material can include shape and structural modifications of a low-dimensional material. The superconductor device can include various conformational arrangements of the low-dimensional material such as nanoribbons, nanotubes, or helices. The superconductor device can include functional groups, such as hydrogen, attached to the low-dimensional material. The superconductor device can include metallic clusters located in proximity to the low-dimensional material. The superconductor device can include a low-dimensional material which is a monolayer, bilayer or multilayer.

Another aspect of the present disclosure relates to a superconductor device having a low-dimensional material. The low-dimensional material has a critical temperature higher than a critical temperature corresponding to a bulk form of the low-dimensional material. The low-dimensional material includes a two-dimensional material.

Another aspect of the present disclosure relates to method of increasing critical temperature of a graphene nanoribbon, comprising suppressing a charge density wave in the graphene nanoribbon.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 6A-6D illustrate configurations of a zigzag graphene nanoribbon of width m=3 with $H_2$ edge functionalization and Boron doping, according to an embodiment.

DETAILED DESCRIPTION

Figure 1:
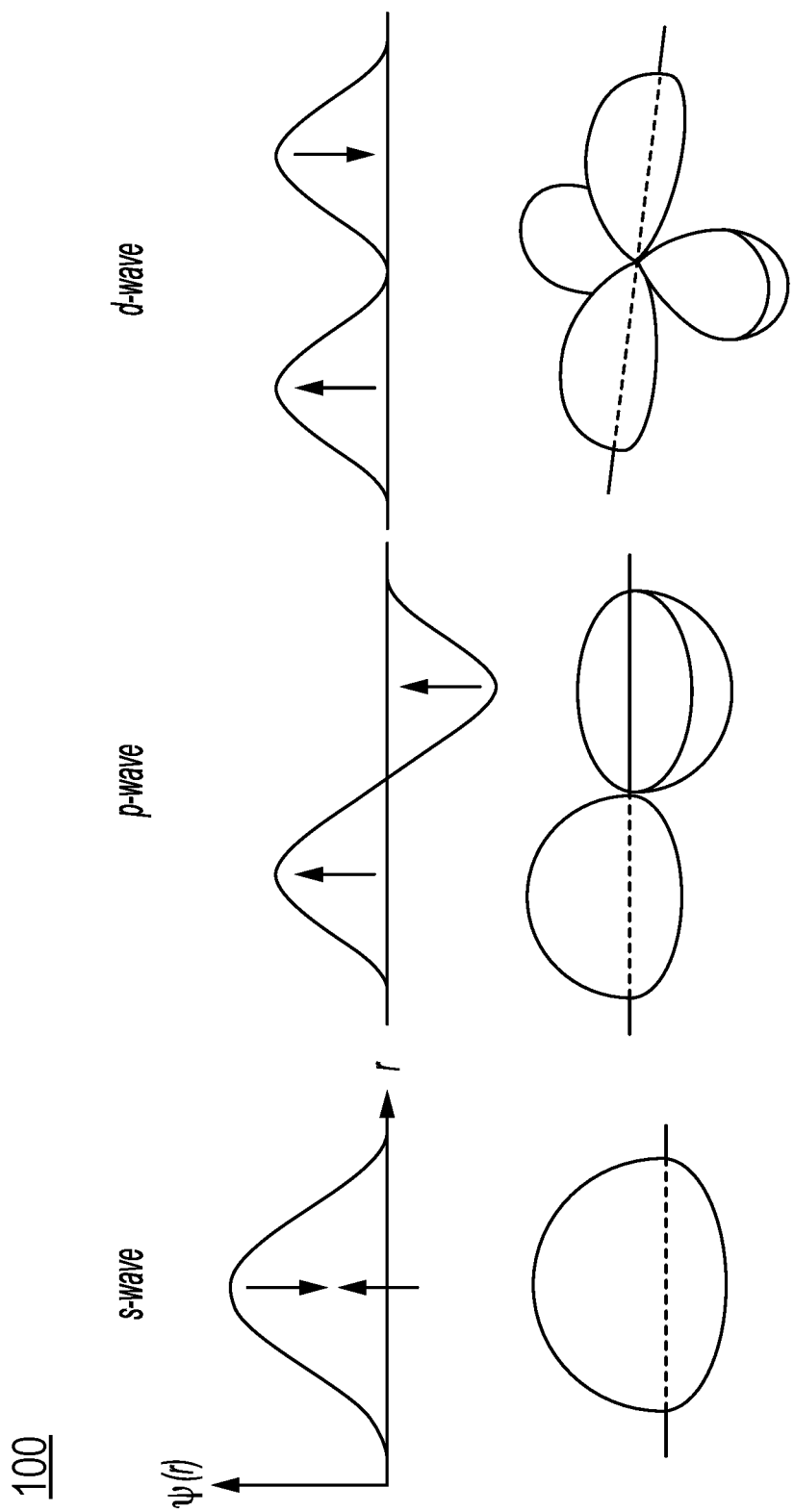
FIG. 1 illustrates symmetry of order parameters for superconductors, according to an embodiment.

Embodiments described herein relate generally to increasing the transition temperature of a superconductor. Cooling costs can be linked to the transition temperature and a superconductor which approaches room temperature could reduce cooling costs of superconductors. Reducing the cooling costs of superconductors may make them a more economic alternative as a magnet material in magnetic resonance imaging (MRI) systems, synchrotrons, flywheels, electronic components, motors and generators. In addition, a superconductor which approaches room temperature can be used for degaussing coils and other applications that require a conducting material of very low or no resistivity and superconducting properties (e.g., the Meissner effect).

In the following detailed description, reference is made to the accompanying drawings, which form a part thereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Superconductivity is a highly correlated electronic state of conducting solids that exhibits zero resistance and excludes magnetic flux (which is called Meissner Effect). Isolated electrons repel each other and this repulsion is due to the Coulomb interaction which is usually negative. Superconductivity involves the formation of pairs of electrons (called Cooper Pairs). In most cases, each Cooper pair includes two electrons with opposite spin and momentum that have a net positive or attractive interaction due to their interaction with an excitation that can overcome the Coulomb repulsion.

For most of currently discovered superconductors (more than 10,000 types), this interaction of the Cooper pair is with the vibrations of the atoms (phonons) that make up the lattice that contains the electrons. This electron-phonon interaction can be interpreted as one electron of the Cooper pair polarizing the lattice and the second electron being attracted to that distortion. The $T_c$ (referred to as transition temperature or critical temperature), which is the temperature at or below which the conductor becomes a superconductor, depends mainly on two features of this interaction: the strength of the coupling to a particular phonon mode and the frequency or energy of that mode. If the phonon spectrum is $F(\omega)$ and the coupling to specific frequencies is $\alpha(\omega)^2$, then the integral of $\alpha(\omega)^2 F(\omega)$ can be used to estimate the $T_c$. For most metals, the phonon spectrum does not extend above 15 milli-electron-volts (meV), which corresponds to a transition temperature only as high as 25 K (Kelvin).

Cuprate superconductors are a group of superconductor materials that contain anionic copper complexes. The cuprate superconductors can have transition temperatures as high as 160 K (under pressure), and the phonon spectrum for some of the cuprates can exceed 60 meV. One reason the phonon energies are so large is that the compound includes the element oxygen, which has relatively low mass as compared to most elements and the lighter the mass of the atom the higher the frequency (and energy) of the oscillation. The oxygen oscillations and the coupling of the electrons to the phonons enable the high $T_c$. For example, $T_c$ of 203 K can occur in $H_2S$ under extreme pressure because hydrogen atoms are very light and the phonon energies are very high. The phonon spectrum may approach 100 meV.

The size of a Cooper pair is referred to as superconducting coherence length. For conventional superconductors with $T_c$ less than 20 K, the superconducting coherence length can be several hundred nanometers. However, in general, the size is inversely proportional to the $T_c$. For example, the coherence length in cuprates can be less than 10 nanometers.

The phonon mechanism is responsible for most of currently discovered superconductors but there may be exceptions. There may be several other excitations that can give rise to superconductivity. These excitations involve interactions of the electrons with an electronic excitation that typically is of higher energy than phonons. These excitations include, e.g., plasmons (collective oscillations of the conducting electrons), excitons (excited states of the electrons), and magnetic excitations (e.g., magnons). In addition to these interactions that occur mainly in momentum space, there are also excitations like polarons and bi-polarons (the interaction with the lattice is so strong that the electrons are physically bound to each other) that occur in real space.

For superconductors, the symmetry is not a good quantum number so the symmetries can be described as "like" rather than definitive. FIG. 1 illustrates symmetry of order parameters 100 for superconductors. These symmetries for superconductors are s-like, where the order parameter is close to symmetric, d-like, where the order parameter has two positive and two negative lobes and points in momentum space where the order parameter goes to zero, and p-like, where the paired electrons have the same spin direction (spin triplet) and there are just two lobes. In a more general Eliashberg theory of superconductivity, the phonon mechanism is transparent to the symmetry, and all symmetries are possible within the phonon mechanism. However, magnetic excitations may require a higher order symmetry.

The properties of superconductors, whose overall scale is of the size of the order parameter, can be significantly affected by the surface or an interface with another material. For instance, the interaction of electrons in the superconductor with states within a few nanometers of an interface or surface can significantly affect the transition temperature. For example, pure aluminum has a $T_c$ of 1.2 K, while granular aluminum, such as aluminum grains surrounded by an aluminum oxide matrix, can have transition temperature several times the $T_c$ of pure aluminum. This is the case for several other elemental superconductors.

Furthermore, superconductivity can occur at the interface between two dielectrics when the interface defects cause the interface to become conducting and then superconducting. This effect occurs at relatively low temperatures (a few Kelvins).

In some embodiments, a nanoscale composite of a cuprate superconductor (e.g., the carriers are provided by doping) with its un-doped analog can be made. The doped regions are separated from the un-doped cuprate by a few nanometers. $T_c$ can be significantly enhanced to as high as room temperature. The reason is that doping the cuprates adds the carriers needed for superconductivity but also adds impurities which can decrease superconducting character. Combining the doped and un-doped cuprates, the carriers from the doped regions leak (tunnel) into the un-doped regions, and in these regions there are no "pair breakers" and thus can exhibit a much higher $T_c$.

Most bulk organic materials are insulators, however, organic materials with delocalized pi electrons are conducting (e.g. graphene and aromatic molecules). Pi electrons in aromatic molecules can form Cooper pairs such that the molecule is in a superconducting state. Small graphene-like molecules (e.g. hexabenzocoronene, corenene, or ovalene) may exhibit room temperature superconductivity due to hydrogen groups with high vibrational frequency. Topologically modifying or functionalizing graphene and other low-dimensional materials may yield a high $T_c$ superconductor.

In some embodiments, the superconductor device includes a low-dimensional material. The low-dimensional material can be a low-dimensional superconducting material. A low-dimensional superconducting material can be a superconductor that has at least one dimension constrained to be less than the coherence length of the superconductor. For example, a two-dimensional superconductor has one dimension constrained to be less than the coherence length of the superconductor. A one-dimensional superconductor has two dimensions constrained to be less than the coherence length of the superconductor. A zero-dimensional superconductor has three dimensions constrained to be less than the coherence length of the superconductor. The low-dimensional material can have a critical temperature higher than a critical temperature corresponding to a bulk form of the low-dimensional material. The low-dimensional material can have a critical field different from a critical field corresponding to a bulk form of the low-dimensional material. The low-dimensional material can have a critical current different from a critical current corresponding to a bulk form of the low-dimensional material. The bulk form of the low-dimensional material can include a material whose properties reflect bulk properties. Bulk properties include properties (i.e. resistivity, reactivity, dielectric strength, capacitance, conductivity, permittivity, permeability or piezomagnetism) that are not constrained in a spatial dimension. In contrast, low-dimensional materials include materials that have properties that are constrained in a spatial dimension and differ from a bulk form of the material. For example, graphene, a low-dimensional material or two-dimensional material, has electronic, optical, thermal and mechanical properties that are substantially different from its bulk form, graphite.

In some embodiments, a low-dimensional material can be a two-dimensional material. For example, the two-dimensional material can include graphene, molybdenum disulfide, tungsten diselenide, graphyne, borophene, germanene, silicone, stanene, phosphorene, bismuthene, graphene, or hexagonal boron nitride. The two-dimensional material can include a graphene nanoribbon. The two-dimensional material can include a width parameter that determines the critical temperature of the low-dimensional material. For example, a graphene nanoribbon can include a width parameter that determines the critical temperature of the graphene nanoribbon. The two-dimensional material can include a length parameter that determines the critical temperature of the low-dimensional material. For example, a graphene nanoribbon can include a length parameter that determines the critical temperature of the graphene nanoribbon. The two-dimensional material can include a length parameter and a width parameter. The length parameter can be substantially greater than the width parameter. For example, a graphene ribbon can have a length that is orders of magnitude greater than the width. In some embodiments, the low-dimensional material can include a plurality of ions, atoms or molecules located between a first monolayer of the two-dimensional material and a second monolayer of the two-dimensional material. For example, a molecule, such as p-terphenyl, can be intercalated between layer or monolayers of the two-dimensional material.

In some embodiments, a low-dimensional material can be a one-dimensional material. For example, the one-dimensional material can include a carbon nanotube, a graphene nanoribbon, or a nanowire. A carbon-nanotube can be a single-walled carbon nanotube or a multi-walled carbon nanotube. A nanowire can be a nanostructure with a diameter on the order of a nanometer. In some embodiments, a low-dimensional material can be a zero-dimensional material. For example, the zero-dimensional material can include a nanocrystal, nanoscale particle, nanoparticle, super atoms (e.g. aluminum clusters such as $Al_7$, $Al_{13}$, $Al_{14}$, $Al_{23}$, or $Al_{37}$), or fullerenes. A nanocrystal can have at least one dimension smaller than 100 nanometers. For example, a nanocrystal can include quantum dots. For example, the low-dimensional material can include a spherical fullerene with metal atoms or compounds incorporated into the cage of the fullerene (e.g. endohedral fullerenes). In some embodiments, fullerenes can include Buckyball clusters, nanotubes, megatubes, polymers, nano-onions, linked ball-and-chain dimers, or fullerene rings.

In some embodiments, a low-dimensional material can include a crystalline material. For example, the crystalline material can be made up of a single layer of atoms. In some embodiments, a low-dimensional material can include a superconductor with a critical temperature above 273.15 K (e.g. above 273.15 K, or above 298.15 K). In some embodiments, a low-dimensional material can include a superconductor with a critical temperature above 100 K. In some embodiments, a low-dimensional material can include a superconductor that is superconducting at standard conditions for temperature and pressure (273.15 K and 1 bar). In some embodiments, a low-dimensional material can include a plurality of defects (e.g. vacancy defects, interstitial defects, Frenkel defects, antisite defects, and substitutional defects).

Figure 2:
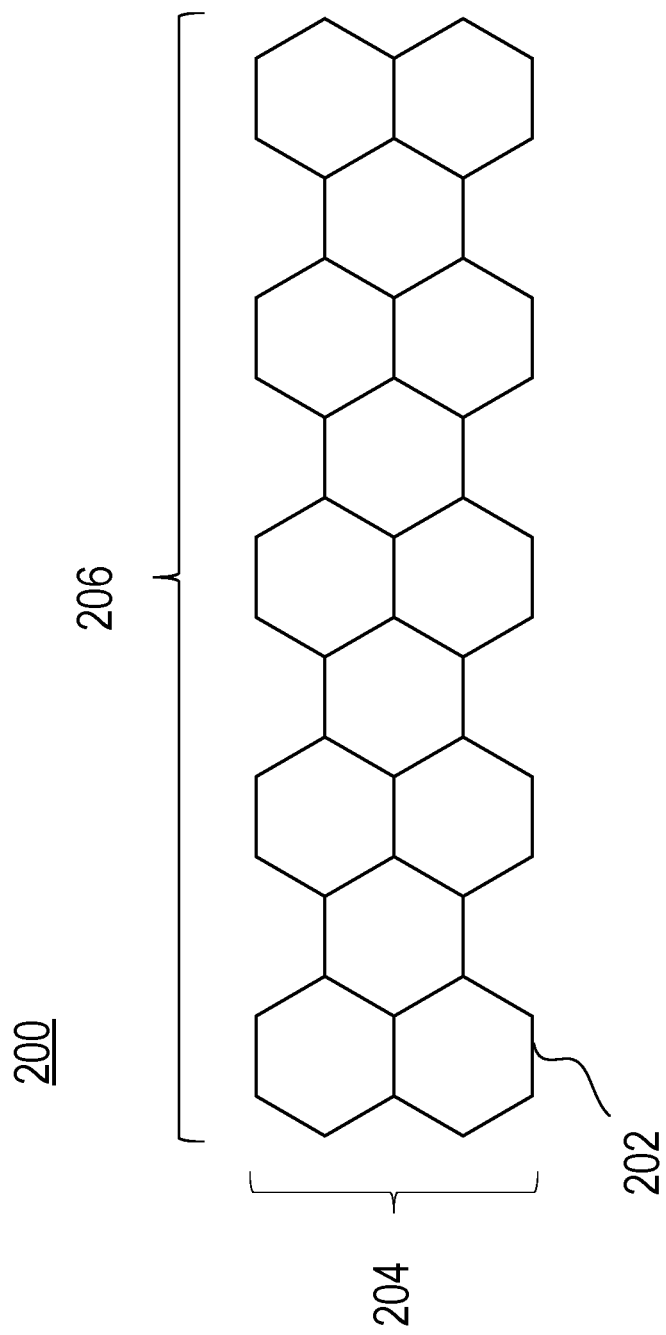
FIG. 2 schematically illustrates a superconductor device including a graphene nanoribbon, according to an embodiment.

FIG. 2 illustrates an embodiment of a superconductor device 200 including a low-dimensional material that is a graphene nanoribbon 202. In some embodiments, the graphene nanoribbon 202 can include a width parameter 204 and a length parameter 206. In some embodiments, the graphene nanoribbon 202 has a critical temperature that depends on the width parameter 204 of the graphene nanoribbon 202. In some embodiments, the graphene nanoribbon 202 includes a critical temperature that depends on the length parameter 206 of the graphene nanoribbon 202. The superconductor device 200 can be stable under ambient conditions.

In some embodiments, the critical temperature of the graphene nanoribbon 202 can be obtained through computational simulations. In some embodiments, the phonon spectra of the graphene nanoribbon 202 can be calculated to obtain an estimate of the critical temperature of the graphene nanoribbon 202. In some embodiments, the electron-phonon coupling constant can be calculated to obtain and estimate of the critical temperature of the graphene nanoribbon 202.

According to some embodiments of the present disclosure, the graphene nanoribbon 202 is synthesized using chemical vapor deposition (CVD) or sublimation of silicon (Si) atoms on silicon carbide (SiC). Chemical vapor deposition of graphene can involve exposing a catalyst material (e.g. Cu, Ni, Pt, Co, etc.) at high temperature (for example, 600° C.-1200° C.) to a hydrocarbon gas (e.g. $CH_4$, $C_2H_2$, $C_2H_4$, etc., usually mixed with $H_2$ and argon or $N_2$) to produce a graphene film. Subsequently, the graphene film can be transferred off the metal catalyst to a target substrate. The transfer procedure can involve coating the graphene layer with a polymer film (e.g. Poly(methyl methacrylate) (PMMA)), removal of the catalyst material by etching (e.g. in iron chloride or ammonium persulfate solutions), delamination, or electrochemical assisted delamination. The graphene polymer stack is then transferred to the target substrate and the polymer is removed with a solvent (e.g. acetone). Once graphene is on the target substrate, the graphene layer is patterned into nanoribbons by lithography. Lithography is accomplished by coating the graphene sample with a photoresist, exposing an electron beam to the sample and developing the photoresist. For example, lithography can include extreme ultraviolet lithography (EUVL). The graphene is then patterned by removing parts of the graphene layer with a light oxygen plasma to obtain the desired structure. According to some embodiments of the present disclosure, a graphene nanoribbon 202 is synthesized by CVD directly (e.g. on Ge(001)) where graphene preferentially grows in one crystallographic orientation along step edges of the Ge substrate.

According to some embodiments of the present disclosure, very narrow graphene nanoribbons 202 are created by a bottom up chemical synthesis from molecular precursors. The synthesis proceeds in two thermally activated steps, where the first step cleaves the halogens from the precursor and forms the covalently coupled polymer (polymerization temperature can occur at approximately 200° C.). The second step converts this structure into graphene at a higher temperature (cyclodehydrogeneation temperature can occur at approximately 320° C.). The molecular precursor may be dibromoperylene $C_{20}H_{10}Br_2$ and the substrate often involves a metallic thin film such as Au(111). According to some embodiments of the present disclosure, graphene nanoribbons 202 are synthesized by unzipping carbon nanotubes (CNTs). Unzipping CNTs can involve gentle etching in argon plasma or chemical etching in acid (e.g. sulfuric acid).

Figure 3:
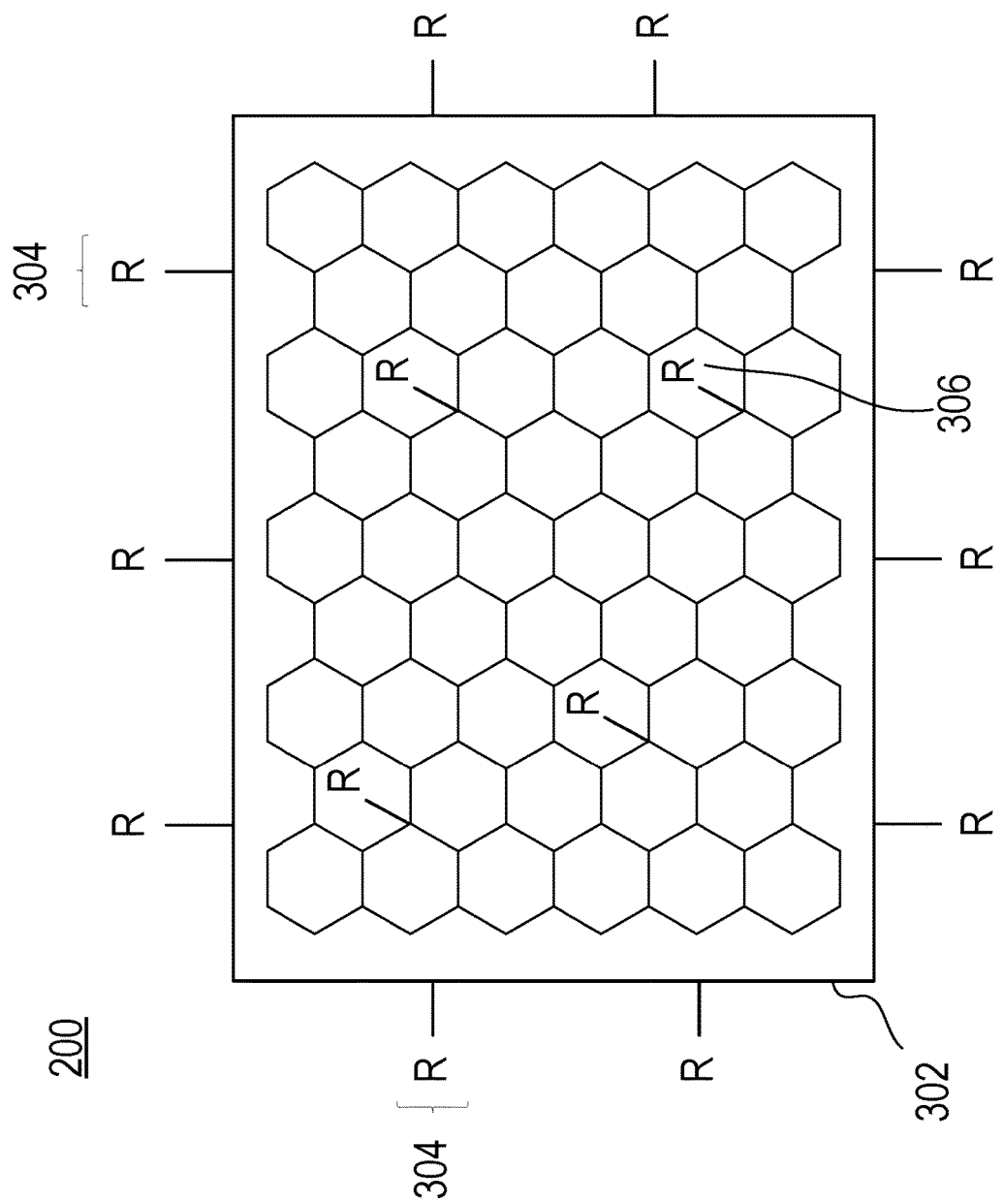
FIG. 3 schematically illustrates a superconductor device including a functionalized low-dimensional material, according to an embodiment.

FIG. 3 illustrates an embodiment of a superconductor device 200 including a low-dimensional material 302 wherein the low-dimensional material 302 includes a plurality of functional groups 304, 306 attached to the low-dimensional material 302. In some embodiments, the functional groups 304 can be attached to the edge of the low-dimensional material 302. The low-dimensional material can include a graphene nanoribbon 202. In some embodiments, the functional groups 306 can be attached to the basal plane of the low-dimensional material. A basal plane is the plane perpendicular to the principal axis in a crystal system. In some embodiments, the low-dimensional material 302 is defective relative to a pristine monolayer. A pristine monolayer of graphene can include graphene which does not have a crystallographic defect. A low-dimensional material which is defective can include a plurality of crystallographic defects. A crystallographic defect can include point defects (e.g. vacancy defects, interstitial defects, Frenkel defects, antisite defects, and substitutional defects). A low-dimensional material which is defective can include a perforated material, such as perforated graphene.

The functional groups 304 attached to the edge of the low-dimensional material can be attached to none, some or all of the edges of the low-dimensional material. The functional groups 304 can be attached in a specific pattern or randomly located on the edge of the low-dimensional material. The functional groups 304 can be comprised of the same or more than one functional group type.

The functional groups 306 attached to the basal plane of the low-dimensional material can be attached to none, some or all of the basal planes of the low-dimensional material. The functional groups 306 can be arranged in a specific pattern or randomly located on the basal plane of the low-dimensional material. The functional groups 306 can be comprised of the same or more than one functional group type.

In some embodiments, the low-dimensional material 302 can include a plurality of functional groups which are attached to an edge of the low-dimensional material 302. In some embodiments, the low-dimensional material 302 can include a plurality of functional groups which are attached to a basal plane of the low-dimensional material 302. The plurality of functional groups can include at least one of hydrogen or potassium. The plurality of functional groups can cover the entire surface of the low-dimensional material 302 (e.g. graphane in the case of fully hydrogenated graphene). The plurality of functional groups can be all the same functional groups or different functional groups. The functional groups group can cover one, some or all of the sides of the low-dimensional material. The high vibrational frequency of hydrogen groups can contribute to high temperature superconductivity. The functional groups can change the density of state of the low-dimensional material without the functional groups. According to some embodiments of the present disclosure, the low-dimensional material 302 can be hydrogen functionalized by exposing the low-dimensional material to a hydrogen plasma. According to some embodiments of the present disclosure, the low-dimensional material 302 can be hydrogen functionalized by chemical hydrogenation. For example, the Birch reduction can hydrogenate graphene, which can include functionalizing the edges and the basal plane of graphene.

In some embodiments, the low-dimensional material can include a hydride. For example, the hydride can be doped with atoms, molecules or ions. The hydride can include a plurality of functional groups attached to the hydride. In some embodiments, the hydride is a superconducting material at standard conditions for temperature and pressure. An example of a hydride is zirconium hydride. Hydrides can also include, for example, aluminium hydride, arsine, beryllium hydride, bismuthine, cadmium hydride, caesium hydride, calcium hydride, calcium monohydride, chromium (II) hydride, cobalt tetracarbonyl hydride, copper hydride, digallane, digermane, diisobutylalumium hydride, germane, indium trihydride, iron hydride, iron tetracarbonyl hydride, iron(I) hydride, iron(II) hydride, lithium aluminum hydride, lithium hydride, magnesium hydride, magnesium iron hexahydride, magnesium monohydride, magnesium nickel hydride, mercury(I) hydride, mercury(II) hydride, metal carbonyl hydride, molybdocene dihydride, nickel hydride, palladium hydride, plumbane, plutonium hydride, potassium hydride, rubidium hydride, scandium hydride, scandium(III) hydride, sodium aluminum hydride, sodium bis(2-methoxyethoxy)aluminium hydride, sodium hydride, stannane, stibine, thallium hydride, titanium hydride, titanium(IV) hydride, tributyltin hydride, tiphenyltin hydride, uranium hydride, yttrium hydride, zinc hydride, zirconium(II) hydride.

The low-dimensional material 302 can include a dopant species. The dopant species may include at least one of an amine, an imine, an organic free radical, an aromatic molecule, boron, gold, bismuth, antimony, bromine, iodine, a diazonium salt, hydrogen, potassium, and an alkyl group. The low-dimensional material 302 can be doped through at least one of liquid gating or electrolyte gating. The low-dimensional material 302 can be chemically functionalized with a dopant species. The dopant species can include a first bound moiety affixed to the low-dimensional material 302 and a first free moiety removably attached to the first bound moiety. The dopant species can change an electronic property of the low-dimensional material. An electronic property can include at least one of crystal symmetry, Fermi level, band structure, carrier population, mobility, tunneling behavior, and conductive character. The low-dimensional material 302 can be doped chemically through an addition of a plurality of chemical species. The low-dimensional material 302 can be doped electrochemically through an application of a voltage. The low-dimensional material 302 can include a dopant species adsorbed onto a surface of the low-dimensional material. In some embodiments, the low-dimensional material is intercalated with a dopant species.

In some embodiments, the low-dimensional material 302 can be introduced to crystallographic defects prior to the addition of functional groups. For example, graphene can be made defective and the unbound carbon atoms can be functionalized with hydrogen. An experiment can be performed in situ in a hydrogen plasma. While defects are formed and graphene is being functionalized in the plasma, the sheet resistance of graphene can be monitored. For example, granular superconducting domains can be formed through the hydrogen functionalization of graphene.

In some embodiments, the low-dimensional material 302 can be protonated by a catalytic reaction of the low-dimensional material 302 (e.g. graphene) by an alkane. For example, the Birch reduction can be used to hydrogenate the edges and basal plane of graphene. In another example, graphene can be functionalized electrochemically through a process that produces hydrogen at the cathode to produce a high local hydrogen concentration at the surface of the graphene.

Metallic clusters contain delocalized electronics and their states form shells similar to those in atoms or nuclei. The presence of shell structure leads to the possibility for electrons to display the phenomenon of pair correlation. In some embodiments, a Josephson tunneling network can be used to form a continuous superconducting network of metallic clusters. For example, the low-dimensional material can form a Josephson tunneling network. In some embodiments, a low-dimensional material (e.g. graphene) can be used as a base substrate for superconducting clusters. Superconductivity in the graphene layer can be induced by the proximity effect from the superconducting cluster. In some embodiments, the low-dimensional material is coupled to a polymer substrate. For example, the low-dimensional material can be bonded to, adhered to, or adsorbed onto a polymer substrate. In some embodiments, the low-dimensional material includes a plurality of $sp^2$ hybridized atoms. For example, the low-dimensional material can be graphene which has carbon bonds in an $sp^2$ configuration. In some embodiments, the low-dimensional material includes a plurality of $sp^3$ hybridized atoms. For example, the low-dimensional material can be graphane which has carbon bonds in an $sp^3$ configuration.

In some embodiments, the low-dimensional material can be a two-dimensional material. The two-dimensional material can include more than one monolayer. A monolayer can be one atom thick. The two-dimensional material can include a plurality of ions located between a first monolayer of the two-dimensional material and a second monolayer of the two-dimensional material. For example, ions of $Ca^{2+}$, $K^+$, or $Fe^{2+}$ can be located or intercalated between layers of the two-dimensional material. The two-dimensional material can include a plurality of atoms located between a first monolayer of the two-dimensional material and a second monolayer of the two-dimensional material. For example, atoms of He, Cu, or Au can be located or intercalated between layers of the two-dimensional material. The two-dimensional material can include a plurality of molecules located between a first monolayer of the two-dimensional material and a second monolayer of the two-dimensional material. For example, molecules of Hz, $CH_4$, $O_2$, or p-terphenyl can be located or intercalated between layers of the two-dimensional material. The two-dimensional material can include a dopant species which is adsorbed onto at least two surfaces of the two-dimensional material.

Figure 4:
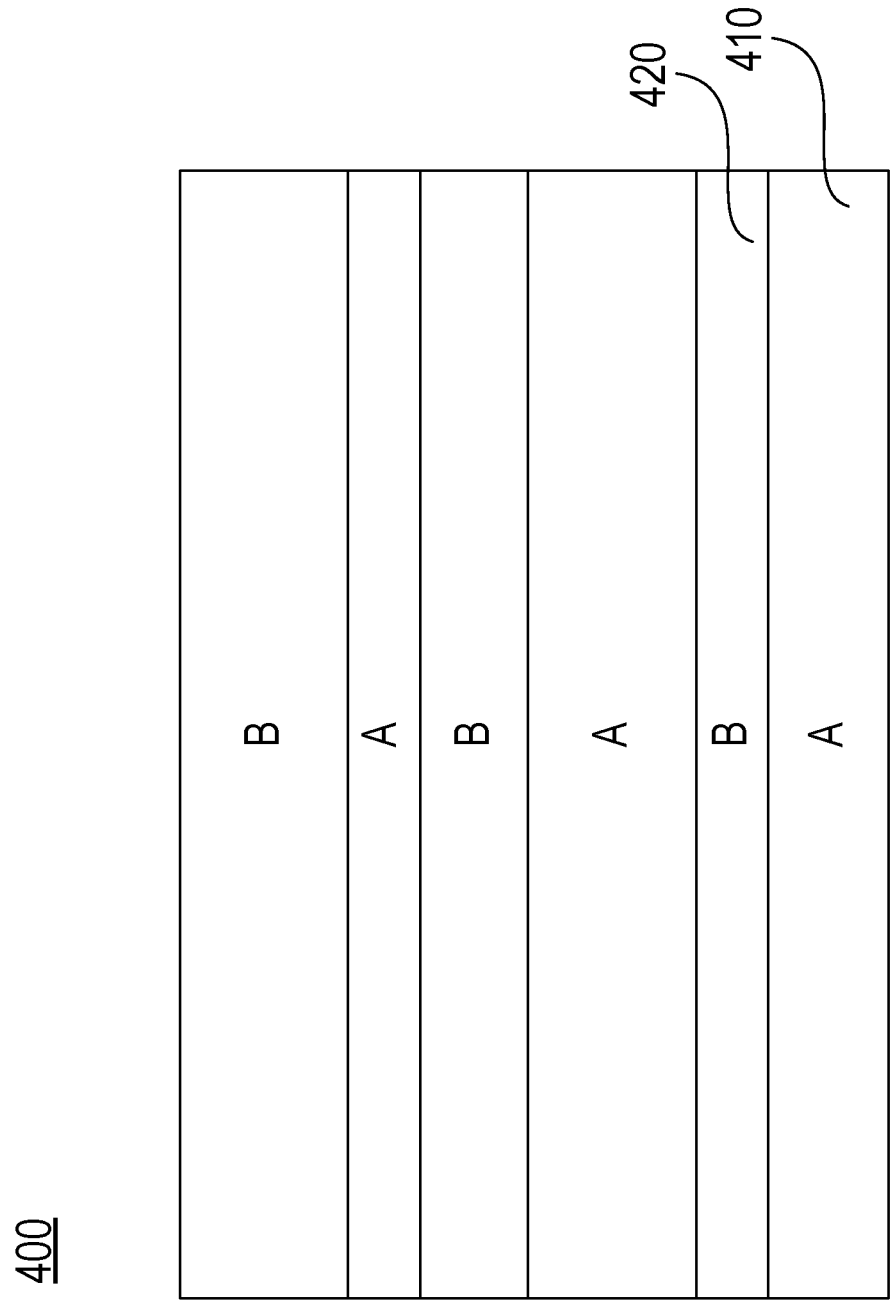
FIG. 4 schematically illustrates a multilayer stack that includes a low-dimensional material, according to an embodiment.

FIG. 4 schematically illustrates a multilayer stack 400 that includes a low-dimensional material. The low-dimensional material can include a first monolayer 410 adjacent to a second monolayer 420. A low-dimensional material can be a crystalline material that is one or a few atoms thick (e.g. 1, 2, 5, or 10 atoms thick). The superconductor device can include a low-dimensional material wherein the low-dimensional material is a monolayer. A monolayer can include a single, closely packed layer of atoms, molecular or cells. The superconductor device can include a low-dimensional material wherein the low-dimensional material is a bilayer. A bilayer can include a double layer of closely packed atoms or molecules. The superconductor device can include a low-dimensional material wherein the low-dimensional material is a multilayer. A multilayer can include a stack of monolayers. In some embodiments, the multilayer can include a multilayer stack. In some embodiments, the multilayer stack can be at least one or more periods. For example, the low-dimensional material can include a first monolayer 410 denoted by A and the second monolayer 420 denoted by B. The multilayer stack can be at least one period of AB or more periods of AB (such as five periods, represented by ABABABABAB). The thickness of layer A and layer B can be constant or variable across each repeating layer. The thickness of layer A can be the same as or different from the thickness of layer B. The first monolayer 410 and the second monolayer 420 can be compositionally the same or different across each repeating layer. For example, monolayer A can have more than one variant, such as $A_1$ and $A_2$. Monolayer B can have more than one variant, such as $B_1$ and $B_2$. A multilayer stack can include stacks such as $ABA_2B_2AB_1A_1B$, or any combination of compositional variants of low-dimensional material. The multilayer stack can promote carrier coupling between layers of the multilayer stack. Stacking layers of low-dimensional material can convert a low-dimensional structure into a structure with higher dimensions. Stacking layers of low-dimensional material can introduce interfaces for carrier coupling. The multilayer stack can create a system of strongly coupled carriers between the monolayers of the low-dimensional material. Coupled carriers are charged particles that interact with each other. These interactions can be caused by one of the fundamental forces, whose strength is given by a dimensionless coupling constant. For example, coupling can occur between layers $A_1$ and $A_2$ or $A_1$ and A of a multilayer stack with a stacking of $A_1B_2A_2BAB_3$.

The superconductor device can include a low-dimensional material wherein the low-dimensional material is a superlattice. A superlattice can include a periodic structure of layers of two or more materials. In some embodiments, the low-dimensional material layers can comprise a stack. In some embodiments, the stack can be encapsulated, for example, by a dielectric material. The dielectric material can include at least one of titanium oxide or aluminum oxide.

In some embodiments, the low-dimensional material can include at least one of graphene, molybdenum disulfide, or tungsten diselenide. In some embodiments, the low-dimensional material can include at least of a graphene nanoribbon, a graphene helix or a single walled carbon nanotube. In some embodiments, the graphene nanoribbon can have a specific edge termination (e.g., armchair edge termination or zig-zag edge termination). The low-dimensional material can include a bundle of nanotubes or a nanotube rope. In some embodiments, the low-dimensional material is a first low-dimensional material and the first low-dimensional material is in immediate proximity to a second low-dimensional material. For example, the first low-dimensional material can be adjacent to a second low-dimensional material.

In some embodiments, the low-dimensional material is a superconducting wire. In some embodiments, the superconducting wire is a component of a photodetector. In some embodiments, the superconducting wire is a component of a quantum computer. In some embodiments, the superconductive wires can be linked together. In some embodiments, the low-dimensional material is an interconnect. In some embodiments, the interconnect is a component of a silicon chip.

In some embodiments, the low-dimensional material is a component of a magnet. In some embodiments, the low-dimensional material is a magnetic component of a flywheel. In some embodiments, the low-dimensional material is a magnetic component of an airplane, a vehicle or a ship. In some embodiments, the low-dimensional material is a magnetic component of a nuclear magnetic resonance device. In some embodiments, the low-dimensional material is at least one of a magnetic field sensor, a photosensor, an optical sensor, a current sensor or a biological sensor.

Figure 5:
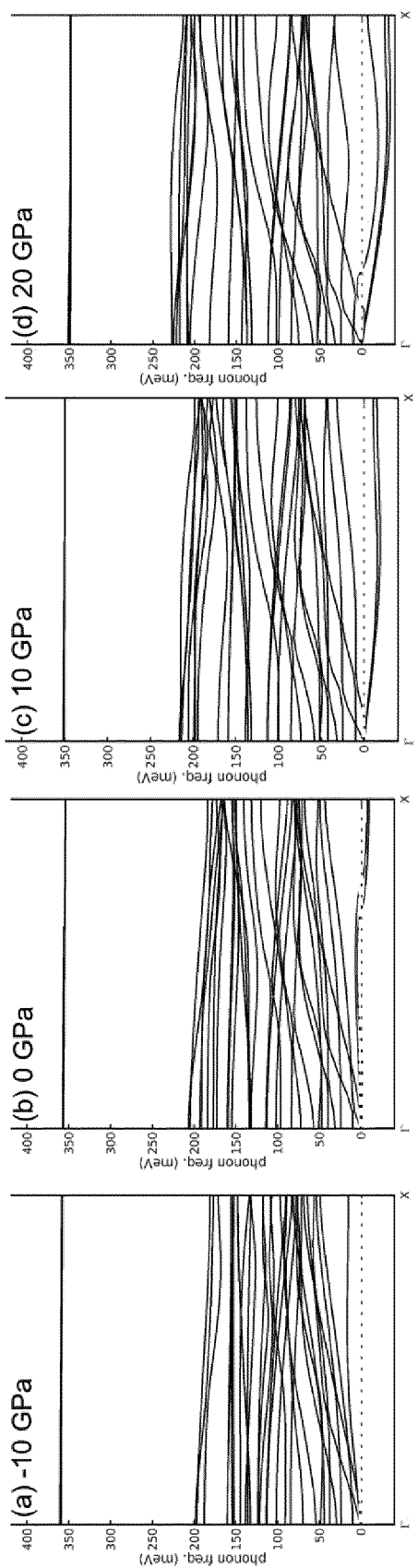
FIG. 5 illustrates the phonon dispersion of a $H_2$-functionalized graphene nanoribbon of width m=3 (H2GNR3) as a function of applied pressure, according to an embodiment.

FIG. 5 illustrates the phonon dispersion of a $H_2$-functionalized graphene nanoribbon of width m=3 (H2GNR3) as a function of applied pressure 500. An $H_2$-functionalized graphene nanoribbon can include a graphene nanoribbon which has terminal carbon atoms functionalized with $H_2$. A width of m=n indicates that the graphene nanoribbon is n rings wide. For example, m=7 indicates that the graphene nanoribbon is 7 rings wide, m=3 indicates that the graphene nanoribbon is 3 rings wide, m=2 indicates that the graphene nanoribbon is 2 rings wide, and m=1 indicates that the graphene nanoribbon is 1 ring wide. Phonon modes that contribute to high $T_c$ may also cause charge density wave instability. Methods to suppress charge density wave instability can be used to obtain a material that has both high $T_c$ and is stable. One method to suppress change density wave instability can include applying stress to a graphene nanoribbon. For example, increasing the critical temperature of a graphene nanoribbon can include applying stress to the graphene nanoribbon. The critical temperature of a graphene nanoribbon under stress can be higher than the critical temperature of an unstressed graphene nanoribbon ((b) 0 GPa). FIG. 5 shows that applying stress to a $H_2$-functionalized graphene nanoribbon of width m=3 suppresses the charge density wave. For a tensile strain of (a) −10 GPa all phonon modes are real whereas for higher pressures (e.g., (c) 10 GPa, (d) 20 GPa) the phonon modes are imaginary. The imaginary modes can be an indication of an instability of the system. Applying stress can suppress the charge density wave of other graphene nanoribbon-like structures (e.g., two dimensional materials, etc.) Application of stress can be achieved by applying the material to a substrate and compressing or straining the substrate material, or exposing the graphene structure to an atmosphere of increased pressure.

In some embodiments, suppressing the charge density wave in the graphene nanoribbon can include disposing the graphene nanoribbon on a substrate material. The substrate material can have a first lattice constant and the graphene nanoribbon can have a second lattice constant. The first lattice constant can be different from the second lattice constant. The charge density wave can be suppressed in this way by a system in which the substrate and the graphene nanoribbon have different or mismatched lattice constants.

Another method to suppress a charge density wave and obtain a stable high $T_c$ structure is by the addition of impurities or defects in the system, or by doping. For example, a high $T_c$ structure can include a graphene nanoribbon backbone and interstitial dopant atoms such as Boron. FIGS. 6A-6D illustrates configurations of a zigzag graphene nanoribbon of width m=3 with $H_2$ edge functionalization and Boron doping 600. The atoms depicted are hydrogen 602, carbon 604, and boron 608. For example, FIG. 6A, FIG. 6B, FIG. 6C, and FIG. 6D illustrate $H_2$-functionalized graphene nanoribbons with Boron dopant atoms. The $T_c$ of the structure can depend on the configuration or placement of Boron atoms. In some embodiments, suppressing the charge density wave in the graphene nanoribbon can include incorporating at least one of an impurity, a defect, an adsorbate, or a dopant into the graphene nanoribbon.

In some embodiments, suppressing the charge density wave in the graphene nanoribbon can include disposing the graphene nanoribbon proximate to a superconducting material such that electrons in the superconducting material interact with phonons in the graphene nanoribbon. For example, a graphene nanoribbon (e.g., $H_2$-functionalized graphene nanoribbon of width m=1) in a semiconducting state can be put in close proximity to a superconducting material such that electrons in the superconducting material interact with phonons in the graphene nanoribbon structure. The graphene nanoribbon and superconducting material combined can create a graphene nanoribbon structure. The graphene nanoribbon and superconducting material combined can create a superconducting material composed of two materials. The graphene nanoribbon may be used as an enhancing material to another superconducting material in close proximity to the graphene nanoribbon structure. The graphene nanoribbon structure may be in a semiconducting state where the electron phonon coupling may be high. However, gating or doping of the graphene nanoribbon structure may cause an instability in the graphene nanoribbon structure. However, electrons in the superconductor can interact with the phonons in the graphene ribbon without causing an instability.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

The term "coupled," as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. Such members may be coupled mechanically, electrically, and/or fluidly.

The term "or," as used herein, is used in its inclusive sense (and not in its exclusive sense) so that when used to connect a list of elements, the term "or" means one, some, or all of the elements in the list. Conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

The construction and arrangement of the elements of the systems and methods as shown in the embodiments are illustrative only. Although only a few embodiments of the present disclosure have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements. It should be noted that the elements and/or assemblies disclosed herein may be constructed from any of a wide variety of materials that provide sufficient strength or durability, in any of a wide variety of colors, textures, and combinations. The order or sequence of any process or method steps may be varied or re-sequenced, according to alternative embodiments. Other substitutions, modifications, changes, and omissions may be made in the design, operating conditions, and arrangement of the preferred and other embodiments without departing from scope of the present disclosure or from the spirit of the appended claims.

What is claimed is:

1. A superconductor device, comprising:
a first monolayer of a low-dimensional superconducting material that includes a first graphene nanoribbon with a width and a length, wherein the length of the first graphene nanoribbon is at least an order of magnitude greater than the width thereof, and where the width of the first graphene nanoribbon is less than a superconducting coherence length thereof;
a second monolayer of the low-dimensional material that includes a second graphene nanoribbon with a width and a length, wherein the length of the second graphene nanoribbon is at least an order of magnitude greater than the width thereof, and where the width of the second graphene nanoribbon is less than a superconducting coherence length thereof,
wherein each of the first and second graphene nanoribbons is chemically functionalized with a dopant species, where the dopant species includes a first bound moiety affixed to the low-dimensional material and a free moiety removably attached to the first bound moiety; and
a plurality of molecules intercalated between the first graphene nanoribbon and the second graphene nanoribbon,
wherein the superconductor device has a higher critical temperature than a critical temperature of a bulk form of the low-dimensional superconducting material, for a given operating pressure.

2. A superconductor device, comprising:
a first monolayer of a low-dimensional superconducting material;
a second monolayer of the low-dimensional superconducting material,
wherein each of the first and second monolayers has at least one dimension that is constrained to be less than a superconducting coherence length thereof, and
wherein each of the first and second monolayers is chemically functionalized with a dopant species that includes a first bound moiety affixed to the low-dimensional material and a free moiety removably attached to the first bound moiety; and
a plurality of ions intercalated between the first monolayer and the second monolayer,
wherein the superconductor device has a higher critical temperature than a critical temperature of a bulk form of the low-dimensional superconducting material.

3. The superconductor device of claim 2, wherein the low-dimensional superconducting material is doped through at least one of liquid gating, electrolyte gating, and application of a voltage.

4. The superconductor device of claim 2, wherein the low-dimensional superconducting material is intercalated with a dopant species.

5. The superconductor device of claim 2, wherein a dopant species is adsorbed onto a surface of the low-dimensional superconducting material.

6. The superconductor device of claim 2, wherein the low-dimensional superconducting material is at least one of a superconducting wire, a component of a photodetector, a component of a quantum computer, an interconnect, and a component of a silicon chip.

7. The superconductor device of claim 2, wherein the low-dimensional superconducting material is at least one of a component of a magnet and a component of a nuclear magnetic resonance device.

8. The superconductor device of claim 2, wherein the low-dimensional superconducting material forms a Josephson tunneling network.

9. The superconductor device of claim 2, wherein the low-dimensional superconducting material is coupled to a polymer substrate.

10. The superconductor device of claim 2, wherein the low-dimensional superconducting material includes at least one of a plurality of $sp^2$ hybridized atoms and a plurality of $sp^3$ hybridized atoms.

* * * * *